United States Patent
Oguri et al.

(10) Patent No.: US 7,760,775 B2
(45) Date of Patent: Jul. 20, 2010

(54) APPARATUS AND METHOD OF GENERATING LASER BEAM

(75) Inventors: Hitoshi Oguri, Chiyoda-ku (JP); Tokutaka Hara, Chiyoda-ku (JP); Masahito Mure, Chiyoda-ku (JP); Miki Yatsuki, Chiyoda-ku (JP)

(73) Assignee: Sumitomo Osaka Cement Co., Ltd., Chiyoda-ku, Tokyo (JP)

( * ) Notice: Subject to any disclaimer, the term of this patent is extended or adjusted under 35 U.S.C. 154(b) by 65 days.

(21) Appl. No.: 11/883,018

(22) PCT Filed: Apr. 14, 2006

(86) PCT No.: PCT/JP2006/307971

§ 371 (c)(1),
(2), (4) Date: Jul. 25, 2007

(87) PCT Pub. No.: WO2006/112412

PCT Pub. Date: Oct. 26, 2006

(65) Prior Publication Data

US 2008/0310466 A1    Dec. 18, 2008

(30) Foreign Application Priority Data

Apr. 15, 2005  (JP) .............................. 2005-119048
Sep. 28, 2005  (JP) .............................. 2005-282455

(51) Int. Cl.
*H01S 3/10*    (2006.01)

(52) U.S. Cl. ....................................................... 372/22

(58) Field of Classification Search .................... 372/22
See application file for complete search history.

(56) References Cited

U.S. PATENT DOCUMENTS

| | | | | |
|---|---|---|---|---|
| 4,995,050 A | * | 2/1991 | Waarts et al. .................. | 372/95 |
| 6,021,141 A | * | 2/2000 | Nam et al. ..................... | 372/20 |
| 7,173,950 B2 | * | 2/2007 | Hand et al. .................... | 372/22 |

FOREIGN PATENT DOCUMENTS

| | | |
|---|---|---|
| EP | 0 625 811 A1 | 11/1994 |
| JP | 09-050629 | 2/1997 |
| JP | 2000-252583 | 9/2000 |
| JP | 2001-311974 | 11/2001 |

(Continued)

OTHER PUBLICATIONS

Raab et al. "External resonator design for high-power laser diodes that yields 400 mW of $TEM_{00}$ power." *Optics Letters* vol. 27, No. 3. Feb. 2002. pp. 167-169.

(Continued)

*Primary Examiner*—Minsun Harvey
*Assistant Examiner*—Patrick Stafford
(74) *Attorney, Agent, or Firm*—Merchant & Gould P.C.

(57) ABSTRACT

A laser beam generating apparatus includes a semiconductor element and a second harmonic generating element that performs a wavelength conversion on fundamental light emitted from the semiconductor element, the laser beam generating apparatus is an external resonance-type laser diode that has an external resonator structure and emits a transversal single mode laser beam, and the second harmonic generating element is a waveguide-type second harmonic generating element that includes a single mode waveguide.

6 Claims, 3 Drawing Sheets

FOREIGN PATENT DOCUMENTS

JP          2002-270933          9/2002

OTHER PUBLICATIONS

Raab et al. "Tuning high-power laser diodes with as much 0.38 W of power and $M^2$ =1.2 over a range of 32 nm with 3-GHz bandwidth." *Optics Letters* vol. 27. No. 22. Nov. 2002. pp. 1995-1997.

Zhang et al. "A Diode Pumped Solid State Yellow Laser at 564.5. nm." *Advanced Solid State Lasers* vol. 10. 1997. pp. 77-78.

Keyword explanation. "Sum Frequency Generation/Difference Frequency Generation." *Optronics*. Dec. 2004. pp. 442.

* cited by examiner

APPARATUS AND METHOD OF GENERATING LASER BEAM

TECHNICAL FIELD

The present invention relates to an apparatus and a method of generating a laser beam having a specific wavelength.

Priority is claimed on Japanese Patent Application No. 2005-119048, filed Apr. 15, 2005, and Japanese Patent Application No. 2005-282455, filed Sep. 28, 2005, the contents of which are incorporated herein by reference.

BACKGROUND ART

As an example of a method of obtaining a laser beam of a deficient wavelength that cannot directly oscillate the laser beam from a gas-state laser, a laser diode (LD), and a solid-state laser, one method has been suggested in Non-Patent Document 1 to be described below. According to this method, oscillation light (having a wavelength of 1122 nm) from an LD pumped solid-state laser is caused to be incident on a second harmonic generating element as fundamental light so as to be subjected to a wavelength conversion, thereby obtaining a laser beam having a wavelength of 561 nm.

Further, a method has been known which obtains a laser beam whose wavelength is converted by sum frequency generation using two laser beams having different wavelengths (for example, Non-Patent Document 2).

(Non-Patent Document 1) OSA TOP Vol. 10 "Advanced Solid State Lasers, 1997, p. 77, A Diode Pumped Solid State Yellow Laser at 564. 5 nm", by X. X. Zhang and W. L Zhou.

(Non-Patent Document 2) "keyword explanation, optical technology general dictionary" published by OPTTRONICS on Dec. 12, 2004, p. 442

However, according to the method disclosed in Non-Patent Document 1, since a structure of the apparatus becomes complicated and a laser host material is high-priced, the cost of the laser is increased. Accordingly, the method is not practical.

According to the method disclosed in Non-Patent Document 2, since two laser light sources are used, the cost of a laser is increased, and a structure of a driving power supply of an optical source becomes complicated. Therefore, this method is also not practical.

The invention has been made to solve the above-described problems, and it is an object of the invention to provide an apparatus and a method of generating a laser beam in which a structure of the apparatus is simple, the laser beam having a predetermined wavelength can be stably generated, and practicability is excellent with the low cost.

DISCLOSURE OF INVENTION

In order to solve the above-described problems, according to an aspect of the invention, a laser beam generating apparatus includes a laser diode, and a second harmonic generating element that performs a wavelength conversion on fundamental light emitted from the laser diode. The laser diode is an external resonance-type laser diode that has an external resonator structure and emits a transversal single mode laser beam, and the second harmonic generating element is a waveguide-type second harmonic generating element that includes a single mode waveguide.

According to another aspect of the invention, there is provided a method of generating a laser beam having a predetermined wavelength by causing fundamental light emitted from a laser diode to be incident on a second harmonic generating element so as to perform a wavelength conversion. The laser diode is an external resonance-type laser diode that has an external resonator structure and emits a transversal single mode laser beam, and the second harmonic generating element is a waveguide-type second harmonic generating element that includes a single mode waveguide.

According to the laser and the method of generating a laser beam according to the invention, since a laser beam having a determined wavelength can be stably generated with a simple structure of the apparatus, it is possible to achieve excellent practicability with the low cost. Further, it is possible to achieve high output intensity of the laser beam.

BEST MODE FOR CARRYING OUT THE INVENTION

Figure 1:
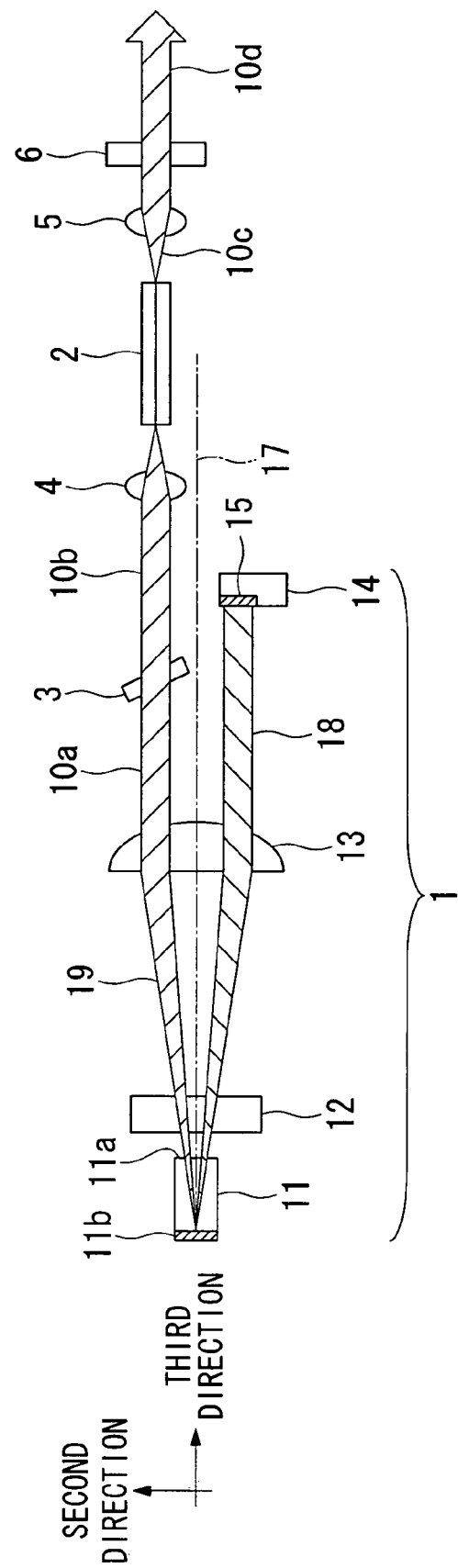
FIG. 1 is a schematic structure view showing a laser beam generating apparatus according to an embodiment of the invention.

FIG. 1 is a schematic structure view showing a laser beam generating apparatus according to an embodiment of the invention.

In FIG. 1, reference numeral 1 indicates an external resonance-type laser diode, reference numeral 2 indicates a waveguide-type second harmonic generating element (hereinafter, also referred to as SHG element), reference numeral 3 indicates a first wavelength filter, reference numeral 4 indicates a condensing unit, reference numeral 5 indicates a collimator, and reference numeral 6 indicates a second wavelength filter.

In this embodiment, the external resonance-type laser diode 1 includes a semiconductor element 11, a first beam shaping element 12, a second beam shaping element 13, and a reflective unit 14.

The semiconductor element 11 that is used in this embodiment emits light in at least two different directions from the same end face (one emission surface 11a), and is, for example, a laser diode with gain waveguide layer. In the laser diode with gain waveguide layer, an active layer of the laser diode has a wide width in a range of approximately 50 to 400 µm along a bonding surface between a p-type semiconductor and an n-type semiconductor. In the laser diode with gain waveguide layer, since a refraction index of the active layer at both ends is increased as a driving current is increased, the active layer has a function as a concave lens, and has the characteristic that the light beam is refracted in two different directions.

A broad-area-type laser diode (BALD) is preferably used as the semiconductor element 11. In particular, in this embodiment, as the semiconductor element 11, it is preferable to use a semiconductor element that has an oscillation wavelength region including an oscillation wavelength of 1120 nm. For example, a broad-area-type laser diode (BALD), which has an oscillation wavelength region including oscillation wavelengths in a range of 720 to 1120 nm, is properly used. In this invention, a preferable broad-area-type laser diode (BALD) is the laser diode with gain waveguide layer, and oscillates a laser beam in which a transversal (spatial) mode is a multimode.

One light beam 18 between light beams that are emitted from the semiconductor element 11 in two directions is used as an external resonance light beam that becomes an exiting light beam of the semiconductor element 11. That is, the one light beam 18 sequentially passes through the first beam shaping element 12 and the second beam shaping element 13 such that the one light beam 18 is collimated as a parallel light beam along a central axis 17 of the semiconductor element 11. The one light beam 18 that has been collimated is reflected on the reflective unit 14. Then, the reflected beam sequentially passes through the second beam shaping element 13 and the first beam shaping element 12 again, returns to the semiconductor element 11, and becomes exciting light of the semiconductor element 11.

Although not shown, it is preferable that an anti-reflection film against a resonance wavelength be formed on an emission surface 11a of the semiconductor element 11. In this embodiment, an anti-reflection film is formed in order to prevent a light beam having a wavelength of 1120 nm from being reflected.

The other light beam 19 sequentially passes through the first beam shaping element 12 and the second beam shaping element 13 such that the other light beam 19 is collimated as a parallel beam along the central axis 17 of the semiconductor element 11 and becomes a light beam 10a emitted from the external resonance-type laser diode 1.

Further, in the semiconductor element 11, a reflective film 11b is formed on a side of an end face thereof that is opposite to the emission surface 11a. Therefore, the laser beam that has returned to the semiconductor element 11 is reflected on the reflective film 11b, and is emitted from the emission surface 11a.

Most of light beam that has propagated an optical path of the one light beam 18 and has returned is reflected on the reflective film 11b, and is then emitted as the one light beam 18. However, a portion of the light beam that has propagated an optical path of the one light beam 18 and has returned is coupled with the other light beam 19 substantially at a time point when it is reflected on the reflective film 11b, and propagates an optical path of the other light beam 19 to be then emitted.

That is, the other light beam 19, and the light beam 10a that is emitted from the external resonance-type laser diode 1 are laser beams that oscillate due to resonance between the reflective unit 14 and the reflective film 11b.

As the reflective film 11b, for example, a dielectric multi-layered film or a metal deposition film may be used.

The first and second beam shaping elements 12 and 13 are disposed to override the optical paths of the light beams 18 and 19 emitted from the semiconductor element 11 in two directions.

In this case, a direction perpendicular to a surface including optical axes of the light beams 18 and 19 that are emitted from the semiconductor element 11 in two directions is defined as a first direction (direction perpendicular to the paper in FIG. 1), a direction along the central axis 17 of the semiconductor element 11 is defined as a third direction, and a direction that is perpendicular to the first direction and the third direction is defined as a second direction.

Between the first and second beam shaping elements 12 and 13, the first beam shaping element 12 that is close to the semiconductor element 11 has a function of narrowing down a light beam emitted in the first direction, and the second beam shaping element 13 has a function of narrowing down an light beam in the first and second directions. In this structure, the light beams 18 and 19 that are emitted from the semiconductor element 11 in the two directions can be collimated by a common optical system (first and second beam shaping elements 12 and 13) with high efficiency.

For example, it is preferable that a fast axis collimator (hereinafter, also referred to as 'FAC') formed by a cylindrical lens be used as the first beam shaping element 12, and a slow axis collimator (hereinafter, also referred to as 'SAC') formed by a spherical lens be used as the second beam shaping element 13.

As the reflective unit 14, a reflective mirror may be used. As the reflective mirror, a partial reflective mirror is preferable in which a specular surface-like reflective surface 15 be only formed in a region where the one light beam 18 (external resonance light) is radiated.

In this structure, a beam shape can be adjusted by adjusting a region where the reflective surface 15 is formed. A method of adjusting a region where the reflective surface 15 is formed may be a method in which a non-reflective region is cut by dicing or a method in which a light absorbing film or an anti-reflection film is formed in a region other than the reflective surface 15.

Further, in the reflective unit 14, a filter film, which selectively reflects only a light beam having a specific wavelength, may be formed in a region where the reflective surface 15 is formed. According to this structure, wavelength selectivity in a resonator structure is increased, which narrows down a spectrum width (line width) of the light beam 10a emitted from the external resonance-type laser diode 1.

In the external resonance-type laser diode 1 that has the above-described structure, an external resonator structure is formed between the semiconductor element 11 (reflective film 11b) and the reflective unit 14 (reflective surface 15). Accordingly, the light beam 10a emitted from the external resonance-type laser diode 1 becomes a transversal (spatial) single mode laser beam.

In this case, 'the transversal (spatial) single mode laser beam' in this invention means that a beam profile obtained by measuring a near field pattern is in a single mode.

Further, a resonance wavelength in the external resonance-type laser diode 1 can be controlled by the length of an optical path that contributes to resonance. In this embodiment, the resonance wavelength can be adjusted by the distance from the reflective film 11b of the semiconductor element 11 to the reflective surface 15.

In this embodiment, a light beam with a wavelength of 1120 nm can be resonated with high efficiency.

In this embodiment, on the optical path of the light beam 10a emitted from the external resonance-type laser diode 1, a first wavelength filter 3 is provided. The first wavelength filter 3 selectively transmits only a specific wavelength. When the first wavelength filter 3 is provided, a spectrum line width of the light beam 10a emitted from the external resonance-type laser diode 1 (transversal single mode laser beam) can be reduced, which optimizes a longitudinal mode.

Of the light beam 10a emitted from the external resonance-type laser diode 1, as a spectrum line width of the transmission emission light beam 10b that has transmitted the first wavelength filter 3, a spectrum width of a laser beam that is measured by a light spectrum analyzer is preferably 1 nm or less, and more preferably, 0.3 nm or less. The transmission emission light beam 10b may be a longitudinal single mode laser beam.

As the first wavelength filter 3, a wavelength filter where a dielectric multi-layered film made of $TiO_2/SiO_2$, $Ta_2O_5/SiO_2$, or the like is provided on a supporting member, or a filter that has a transmissive Fabry-Perot type etalon structure or a grating structure may be used. In this embodiment, the first wavelength filter 3 is constructed to selectively transmit a light beam having a wavelength of 1120 nm.

The first wavelength filter 3 is disposed such that an incident surface of the first wavelength filter 3 at the external resonance-type laser diode 1 side has the inclination with respect to a surface perpendicular to an optical axis of the light beam 10a. According to this structure, a light beam having an unnecessary wavelength reflected by the first wavelength filter 3 can be prevented from propagating inversely the optical path of the light beam 10a and returning to the semiconductor element 11. As a result, it is possible to suppress an operation of the semiconductor element 11 from being unstable due to the returning of the light beam having the unnecessary wavelength.

In this embodiment, of the light beam 10a emitted from the external resonance-type laser diode 1, the transmission emission light 10b that has transmitted the first wavelength filter 3 is incident on the SHG element 2 through the condensing unit 4.

The SHG element 2 includes a single mode waveguide. In the SHG element 2, a single mode waveguide is preferably provided on a substrate that is made of a ferroelectric material. In this embodiment, a polarization-inversion-type SHG element is preferably used in which a polarization direction of the dielectric material is periodically inverted in a longitudinal direction of the waveguide. Specifically, a waveguide-type PPLN (Periodically Poled Lithium Niobate), which is obtained by periodically performing domain-inversion by proton exchange in an MgO-doped LN (lithium niobate), is appropriately used.

The transmission light beam 10b serving as a fundamental light is incident on the SHG element 2, which obtains the light beam 10c whose wavelength has been changed.

The wavelength conversion in the SHG element 2 can be controlled by a parameter, such as an inversion width. In this embodiment, when as the fundamental light, a light beam having a wavelength of 1120 nm is incident, a light beam having a wavelength of 560 nm (light beam 10c) is emitted from the SHG element 2.

Since the condensing unit 4 causes the transmission emission light beam 10b to be incident on the SHG element 2 with high efficiency, a condensing lens having an appropriate focal distance (for example, F=1.3 to 4.0) is appropriately used.

The light beam 10c emitted from the SHG element 2 is incident on the second wavelength filter 6 through the collimator 5. The second wavelength filter 6 is constructed such that it cuts the fundamental light (light beam having a wavelength of 1120 nm in this embodiment) and transmits the light beam 10c emitted from the SHG element 2 (light beam having a wavelength of 560 nm in this embodiment). In this embodiment, for example, an IR (infrared) cut filter or the like can be appropriately used.

Therefore, a light beam 10d having a desired specific wavelength (light beam having a wavelength of 560 nm in this embodiment) is emitted from the second wavelength filter 6.

In the laser beam generating apparatus according to this embodiment, if the semiconductor element 11 operates, a transversal single mode laser beam (light beam 10a) having a wavelength of 1120 nm is emitted from the external resonance-type laser diode 1. In addition, after the spectrum line width of the transversal single mode laser beam is reduced by the first wavelength filter 3, the transversal single mode laser beam is incident on the SHG element 2 as the fundamental light and is then subjected to a wavelength conversion, which obtains a laser beam (light beam 10d) having a wavelength of 560 nm.

Accordingly, the laser according to this embodiment can be used as a light source that emits a laser beam having a deficient wavelength of 560 nm.

In the laser beam generating apparatus according to this embodiment, since the waveguide-type SHG element that includes the single mode waveguide is used as the SHG element 2, light conversion efficiency in the SHG element 2 is excellent.

However, generally, if the incident fundamental light is a multimode light beam, generation of the laser beam in the waveguide-type SHG element is extremely unstable. The reasons are as follows. (1) If the fundamental light is a transversal multimode light beam, coupling with the single mode waveguide of the waveguide-type SHG element becomes unstable, and (2) if a spectrum line width of the fundamental light is large, in the SHG element 2, matching with a phase matching condition that is set to be suitable for a specific wavelength becomes unstable.

Meanwhile, in this embodiment, the laser having the external resonator structure (external resonance-type laser diode 1) is used, and the light beam 10a emitted from the external resonance-type laser diode 1 becomes a transversal single mode light beam. Therefore, the coupling with the SHG element 2 having the single mode waveguide becomes excellent.

Further, since the first wavelength filter 3 is provided on the optical path of the light beam 10a emitted from the external resonance-type laser diode 1, a spectrum line width is reduced (narrowed) in the transmission emission light beam 10b that transmits the first wavelength filter 3. As a result, matching with the phase matching condition in the SHG element 2 becomes stable, and output intensity is increased.

In this case, as for the longitudinal mode (spectrum line width) of the transmission light beam 10b (fundamental light) that is incident on the SHG element 2, if fluctuation does not occur in the inversion period in the SHG element 2, the transmission emission light beam 10b is preferably a longitudinal single mode laser beam. However, since slight fluctuation generally occurs in the inversion period in the SHG element 2, it is preferable to cause the fundamental light having an appropriate spectrum line width according to the fluctuation to be incident in order to increase the output intensity.

Further, the SHG element 2 is constructed such that desired fluctuation occurs in the inversion period and the spectrum line width of the transmission emission light beam 10b has an appropriate size according to the fluctuation, in terms of the improvement of the output intensity.

Accordingly, a semiconductor element that oscillates a multimode light beam can be used as the semiconductor element 11. For example, it is preferable that a broad-area-type laser diode (BALD) be used as the semiconductor element 11, and the external resonance-type laser diode be constructed by a combination with at least one beam shaping element. Since the BALD can cope with a width band wavelength, it has an advantage in that the wavelength change of the light beam 10a from the external resonance-type laser diode 1 is easy by changing the resonance wavelength in the external resonance-type laser diode 1 and using the SHG element 2 corresponding to the resonance wavelength.

As such, according to the apparatus and the method of generating the laser beam according to this embodiment, the light beam emitted from the semiconductor element 11 can be efficiently and stably subjected to a wavelength conversion with a simple laser structure, which obtains a laser beam in a practical visible light region. For example, the laser beam having a deficient wavelength of 560 nm can be stably obtained with practical intensity.

Further, in the external resonance-type laser diode 1 according to this embodiment, the first beam shaping element 12 having a function of narrowing down the light beam in the first direction and the second beam shaping element 13 having a function of narrowing down the light beam in the first and second directions are provided. Therefore, the beam shapes in the resonator can be equal in the first direction (for example, vertical direction) and in the second direction (for example, horizontal direction). At this time, spreading angles of the light beam 10a from the resonator in two directions are equal to each other, and astigmatism is removed. As a result, the coupling with the SHG element 2 having the single mode waveguide is improved.

For example, in this embodiment, in regards to a ratio (conversion radio, that is, 10d/10a) of the intensity of the laser beam (light beam 10d) having a wavelength of 560 nm finally emitted from the laser beam generating apparatus to the intensity of the light beam 10a from the external resonance-type laser diode 1, it is possible to achieve high conversion efficiency in which the ratio is preferably in a range of 15 to 30%.

Further, in this embodiment, the first wavelength filter 3 is provided on the optical path of the light beam 10a emitted from the external resonance-type laser diode 1. However, even though the first wavelength filter 3 is provided on the optical path of the one light beam 18 between the second beam shaping element 13 and the reflective unit 14, the same effect can be obtained.

Figure 2:
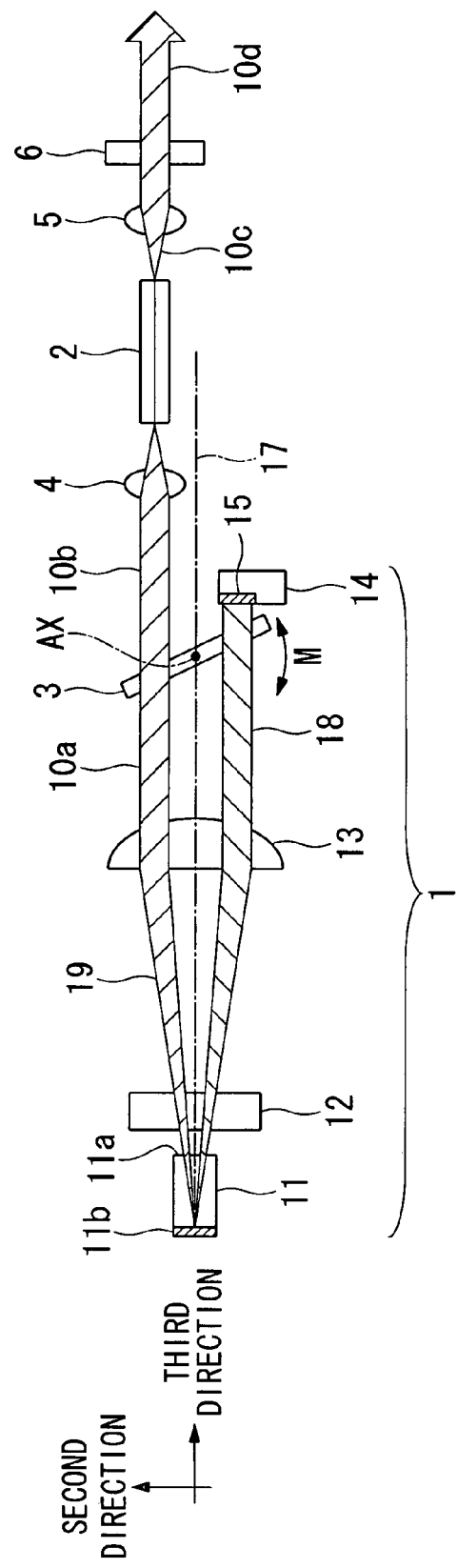
FIG. 2 is a schematic structure view showing a laser beam generating apparatus according to another embodiment of the invention.

Further, as shown in FIG. 2, a third wavelength filter 3' having the same function as the first wavelength filter 3 may be provided to override the optical path of the one light beam 18 and the optical path of the light beam 10a from the external resonance-type laser diode 1 between the second beam shaping element 13 and the reflective unit 14. In this way, the spectrum width (line width) of the light beam 10a emitted from the external resonance-type laser diode 1 can be further narrower.

Figure 3:
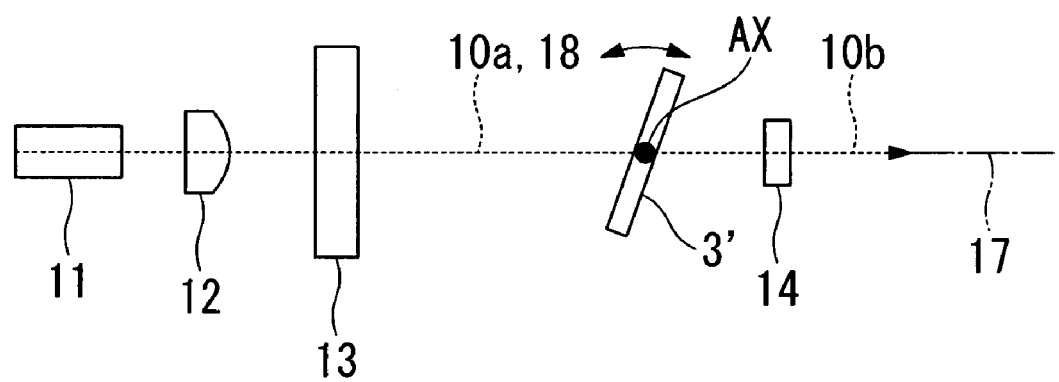
FIG. 3 is a schematic structure view showing a laser beam generating apparatus according to another embodiment of the invention.

Further, as shown in FIG. 3, the third wavelength filter 3' may be parallel to a plane including the light beam 10a and the one light beam 18 (external resonance light beam) emitted from the semiconductor element and may be inclined to a rotational axis AX perpendicular to a central optical axis (central axis 17 of the semiconductor element) of the light beam 10a and the one light beam 18. As a result, an incident angle of the light beam 10a to the third wavelength filter 3' and an incident angle of the one light beam 18 to the third wavelength filter 3' are maintained at the same value, and the transmission spectrum distributions of the light beam 10a and the one light beam 18 in the third wavelength filter 3' can be equal to each other. As a result, it is possible to prevent the reduction of a light amount of the light beam 10d from the laser according to the mismatching of the spectrums, and the reduction of the resonance output due to the mismatching of the spectrums. FIG. 3 is a view showing the laser beam generating apparatus when viewed from the second direction (horizontal direction).

Further, the external resonator structure in the external resonance-type laser diode 1 may be constructed such that the transversal single mode emission light beam is obtained even when the light beam oscillated from the semiconductor element 11 is a multimode laser beam. Accordingly, the invention is not limited to the structure according to the above-described embodiment, but another external resonator structure may be applied.

EXAMPLE

As an example, the laser that has the structure shown in FIG. 2 is manufactured.

In the semiconductor element 11, the BALD is used which includes a laser diode with gain waveguide layer and uses oscillation wavelengths of 1115 to 1125 nm.

As the first beam shaping element 12, an FAC is used which includes a cylindrical lens (optical fiber piece) having a diameter of 125 μm, a refraction index of 1.45, and a focal distance of 0.08 mm.

As the second beam shaping element 13, an SAC is used which includes an axis symmetric spherical lens having a focal distance of 20 mm.

As the reflective unit 14, a reflective mirror is used in which a region of the horizontal 3 mm× the vertical 3 mm is mirror-finished.

The distance between the semiconductor element 11 and the reflective unit 14 is set such that a resonance wavelength becomes 1120 nm.

As the third wavelength filter 3', a light beam having a wavelength of 1120 nm is selectively transmitted by using a dielectric multilayered film filter made of $Ta_2O_5/SiO_2$, and the other light beam is cut. The third wavelength filter 3' is provided to override the optical path of the one light beam 18 and the optical path of the light beam 10a from the external resonance-type laser diode 1 between the second beam shaping element 13 and the reflective unit 14.

As the condensing unit 4, a condensing lens having a focal distance of 1.65 nm is used.

As the SHG element 2, a waveguide type PPLN (Periodically Poled Lithium Niobate), which is obtained by periodically performing domain-inversion by proton exchange in an MgO-doped LN (lithium niobate), is appropriately used. The inversion width is in a range of 7.2 to 7.7 μm.

As the collimator 5, a condensing lens having a focal distance of 1.65 is used.

As the second wavelength filter 6, an IR cut filter having a cut wavelength of 900 to 2000 nm is used.

In the laser according to this embodiment, the semiconductor element 11 is driven by a driving voltage of 1.21 V and a driving current of 800 mA.

The output intensity of the light beam 10a emitted from the external resonance-type laser diode 1 is 300 mW. It is confirmed by a beam profiler (product name: Beamaster Fx-50, manufactured by OPHIR) that the output light 10a is a transversal single mode light beam.

The central wavelength of the light beam 10d emitted from the second wavelength filter 6 is 560 nm, the spectrum line width thereof is 0.03 mm, and the output intensity is 30 mW.

INDUSTRIAL APPLICABILITY

The apparatus and the method of generating a laser beam according to the embodiment of the invention are effective when implementing the laser light source of a visible light region.

The invention claimed is:
1. A laser beam generating apparatus comprising:
a laser diode; and
a second harmonic generating element that performs a wavelength conversion on fundamental light emitted from the laser diode, wherein the laser diode is an external resonance-type laser diode which comprises:
  a broad-area-type laser diode which oscillates a laser beam in which a transversal (spatial) mode is a multimode, and emits light beams in a first direction and a second direction; and
  an external resonator structure, which comprises:
  beam shaping elements, which collimate the light beam emitted in the first direction and the light beam emitted in the second direction, respectively; and
  a partial reflective mirror, in which a reflective region is adjusted to reflect partially the light beam emitted in the first direction, and the light beam reflected by the partial reflective mirror is returned to the broad-area-type laser diode,
the laser diode emits a transversal single mode laser beam in the second direction, and
the second harmonic generating element is a waveguide-type second harmonic generating element that includes a single mode waveguide.

2. The laser beam generating apparatus according to claim 1, further comprising:
  a wavelength filter that is provided on a light path through which light emitted from the external resonance-type laser diode reaches the waveguide-type second harmonic generating element.

3. The laser beam generating apparatus according to claim 2,
  wherein an incidence surface of the wavelength filter at the laser diode side has the inclination with respect to a surface that is perpendicular to an optical axis of the light emitted from the laser diode.

4. The laser beam generating apparatus according to claim 3,
  wherein the inclination of the wavelength filter has a rotational axis that is parallel to a plane including light emitted from the laser diode and external resonance light emitted from the semiconductor element, and is perpendicular to central optical axes of the light emitted from the laser diode and the external resonance light.

5. A method of generating a laser beam having a predetermined wavelength by causing fundamental light emitted from a laser diode to be incident on a second harmonic generating element so as to perform a wavelength conversion,
  wherein the laser diode is an external resonance-type laser diode which comprises:
    a broad-area-type laser diode which oscillates a laser beam in which a transversal (spatial) mode is a multimode, and emits light beams in a first direction and a second direction; and
    an external resonator structure, which comprises:
      beam shaping elements, which collimate the light beam emitted in the first direction and the light beam emitted in the second direction, respectively; and
      a partial reflective mirror, in which a reflective region is adjusted to reflect partially the light beam emitted in the first direction, and the light beam reflected by the partial reflective mirror is returned to the broad-area-type laser diode,
  the laser diode emits a transversal single mode laser beam in the second direction, and
  the second harmonic generating element is a waveguide-type second harmonic generating element that includes a single mode waveguide.

6. The method of generating a laser beam according to claim 5, comprising:
  reducing a spectrum line width of the transversal single mode laser beam before causing the transversal single mode laser beam emitted from the external resonance-type laser diode to be incident on the second harmonic generating element.

* * * * *